United States Patent [19]

Nakahara et al.

[11] Patent Number: 5,110,762
[45] Date of Patent: May 5, 1992

[54] MANUFACTURING A WIRING FORMED INSIDE A SEMICONDUCTOR DEVICE

[75] Inventors: Moriya Nakahara; Yasuyuki Saito; Kenichi Shirai, all of Yokohama; Yasushi Itabashi, Tokyo; Takashi Turugai, Kitagami, all of Japan

[73] Assignee: Kabushiki Kaisha Toshiba, Kawasaki, Japan

[21] Appl. No.: 376,655

[22] Filed: Jul. 7, 1989

[30] Foreign Application Priority Data

Jul. 7, 1988 [JP] Japan ................ 63-169654
Dec. 19, 1988 [JP] Japan ................ 63-318636

[51] Int. Cl.$^5$ .............................. H01L 21/44
[52] U.S. Cl. ................ 437/189; 437/192; 437/195
[58] Field of Search ............ 437/189, 192, 195

[56] References Cited

U.S. PATENT DOCUMENTS

| | | | |
|---|---|---|---|
| 4,107,726 | 8/1978 | Schilling | 357/71 |
| 4,582,563 | 4/1986 | Hazuki et al. | 437/192 |
| 4,666,737 | 5/1987 | Gimpelson | 437/192 |
| 4,720,908 | 1/1988 | Wills | 437/192 |
| 4,764,484 | 8/1988 | Mo | 437/192 |
| 4,800,177 | 1/1989 | Nakamae | 437/192 |
| 4,822,753 | 4/1989 | Pintchokski | 437/190 |

FOREIGN PATENT DOCUMENTS

| | | | |
|---|---|---|---|
| 59-018659 | 1/1984 | Japan | 437/192 |
| 139026 | 6/1986 | Japan | 437/192 |
| 55932 | 3/1988 | Japan | 437/192 |
| 36051 | 2/1989 | Japan | 437/192 |

OTHER PUBLICATIONS

E. K. Broadbent et al., "High-Density High-Reliability Tungsten Interconnection by Filled Interconnect Groove Metallization", IEEE Transactions on Electron Devices, vol. 34, No. 7, Jul. 1988, pp. 952-956.

*Primary Examiner*—Brian E. Hearn
*Assistant Examiner*—Laura Holtzman
*Attorney, Agent, or Firm*—Foley & Lardner

[57] ABSTRACT

A method of manufacturing wiring layers of semiconductor devices in which a base layer made of electroconductive material is formed on a wiring-intended area of the substrate surface and an insulating layer is formed on the area other than the wiring intended area. Then the wiring layer is grown on the base layer up to substantially the same level as that of the insulating layer up, hereby planarity of the surfaces of the device is maintained after wiring formation.

4 Claims, 12 Drawing Sheets

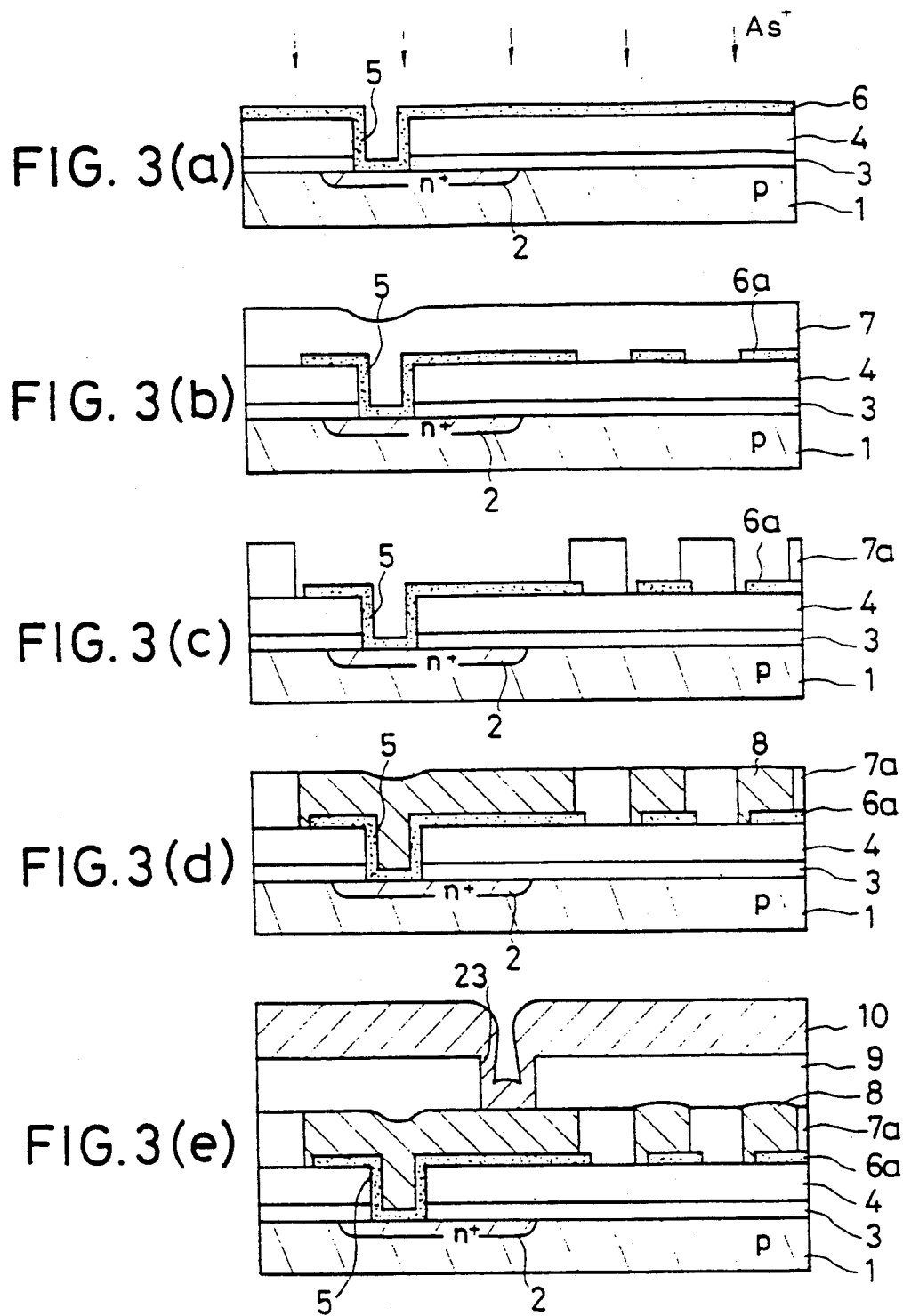

MANUFACTURING A WIRING FORMED INSIDE A SEMICONDUCTOR DEVICE

BACKGROUND OF THE INVENTION

This invention relates to semiconductor device and its manufacturing method, particularly to a wiring formed inside semiconductor device and its manufacturing method.

The metalization technique to form wiring plays a very important role in manufacturing semiconductor integrated circuits. Particularly with recent high-density integration of device component parts, the wiring line width is also being shifted from the micron order to the submicron order. In addition, wiring lines are deposited with two, three or more layers to increase the degree of freedom in pattern design.

Conventional semiconductor devices and their manufacturing method are described by the sectional drawings of FIG. 1.

First of all, as shown in FIG. 1(a), an n+-type diffusion layer 2 is formed in the specified position on the surface of a p-type semiconductor substrate 1 before a silicon oxide layer 3 is deposited on the entire surface by the CVD method. A BPSG layer 4 is also deposited on the entire surface of this silicon oxide layer 3.

Contact holes 5 are then formed on the n-type diffusion layer 2 by a lithographic technique and a reactive ion etching technique (RIE).

Next, as shown in FIG. 1(b), aluminum is deposited on the entire surface by sputtering before patterning is made according to the first wiring pattern by the lithographic technique and the first aluminum wiring 21 is formed.

As shown in FIG. 1(c), a silicon oxide layer 22 is deposited on the entire surface by a plasmatic CVD method, and then the surface is planarized, for example, by etch-back, and further through holes 23 are formed to connect with the first aluminum wiring 21.

Further, as shown in FIG. 1(d), aluminum is deposited on the entire surface, patterning is made according to the second wiring pattern and the second aluminum wiring 26 is formed. Finally, the whole surface is coated with a PSG passivation layer 27.

However, the semiconductor devices manufactured by the above-mentioned conventional method have had the following problems.

In the conventional method, the wiring material of aluminum is deposited by sputtering. Therefore, the sputtering of aluminum atoms is in one direction and only a little aluminum is deposited on the side walls of concaves like contact holes 5, sometimes in such a very small thickness as ten percent of the aluminum layer thickness of the flat part. Furthermore, this may cause a gap 28 as shown in FIG. 1(d). Phenomena like this become notable with an increased ratio (aspect ratio) of the sum of the thickness of the BPSG layer 4 and silicon oxide layer 3 to diameter D of contact hole 5 because of microminiaturization of component parts. The aspect ratio also increases with microminiaturization in the case of through holes. When the layer thickness of the first aluminum wiring 5 on the side wall of contact hole 5 becomes thinner, electromigration and/or stressmigration occur, resulting in lower reliability of the wiring.

Furthermore, the aluminum wiring has to be microminiaturized for higher integration of the semiconductor device. However, it was very difficult to form finer wiring patterns by conventional manufacturing methods. Even if finer resist patterns could be achieved with advanced lithographic techniques, accurate etching using the resist patterns becomes impossible. The reason for this is that the bottom area of the resist patterns is removed at the time of etching because the sectional shape of the resist pattern is trapezoidal and the side of aluminum is etched to a narrower pattern width.

Furthermore, in the photo-engraving process (PEP) using the photographic etching technique, irradiation of electromagnetic waves unnecessary for wiring resist patterns occurs because of reflection from wiring material, etc. at level differences caused by unevenness under the resist film during the exposure to electromagnetic waves, such as g-ray (436 nm) or ultraviolet rays after lamination of the resist film. Consequently, when the resist is of positive type, lack of the developed resist patterns occurs in the part exposed to unnecessary electromagnetic waves. Therefore, if the wiring material is etched using a resist pattern as a mask, the wiring becomes vermiculated. When the resist is of the negative type, an unexpected wiring pattern is formed in the area of the exposed wiring pattern exposed to unnecessary electromagnetic waves. This condition leads to a defect and lower reliability of the wiring, so it can be understood that the inferiority of planarity caused by an increased degree of integration is a problem.

Furthermore, generally speaking, silicon oxide layer 22 or 27 is deposited as an interleveldielectric film after the aluminum wiring is formed. By conventional deposition methods, the shape of deposition becomes overhung as a silicon oxide layer 22 shown in FIGS. 2(a) and (b). For this reason, depositing over a certain thickness forms cavities 24 on the space of aluminum wiring 21 and/or contact holes 5 as shown in FIGS. 1(c), (d), 2(a) and (b).

In conventional cases, as mentioned above, the decrease of thickness of the aluminum circuit layer on the side wall of contact holes, difficulty of micropattern formation, vermiculation of the wiring caused by reflection on level differences, formation of a unexpected wiring pattern and the existence of cavities in the silicon oxide layer have caused lower reliability of semiconductor devices. These problems have become more important with the microminiaturization and complexity of recent semiconductor devices.

SUMMARY OF THE INVENTION

This invention is made in view of the abovementioned situation and the object of this invention is to provide a more reliable semiconductor device in which a fine wiring pattern having good controllability is formed, the wiring layer thickness necessary for complete wiring is secured, step coverage is improved, and there are no cavities in the interleveldielectric film, as well as to provide a manufacturing method for the semiconductor device.

The semiconductor device according to this invention has a base layer which is made of an electroconductive material formed on an area intended for wiring on the surface of semiconductor substrate and a wiring layer grown on the base layer.

The manufacturing method according to this invention includes the step to form a base layer of an electroconductive material on the area intended for wiring on the surface of semiconductor substrate and the step to grow a wiring layer on the base layer.

It is preferable that an insulating layer is formed outside the area intended for wiring on the surface of the semiconductor substrate and that the wiring layer grows to the same level as this insulating layer. Then, a good surface planarity of the device can also be maintained also after formation of the wiring layer.

The method of this invention may form additional wiring layers in the same way after one wiring layer has been formed. Multilayer wiring may be made by repeating the above-mentioned operations while still maintaining a good planarity of surface.

BRIEF DESCRIPTION OF THE DRAWING

FIGS. 3(a) to (e) are sectional views illustrating the manufacturing method of a semiconductor device, in the order of the steps according to the first embodiment of this invention.

DESCRIPTION OF PREFERRED EMBODIMENTS

Figure 1A:
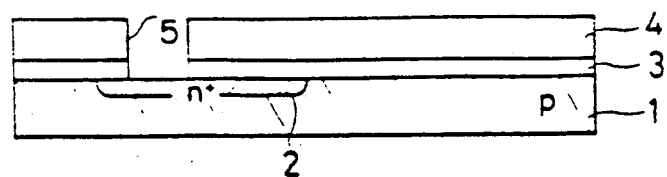
FIGS. 1(a) to (d) are sectional views illustrating a manufacturing method of conventional semiconductor devices, in the order of the steps.
Figure 1B:
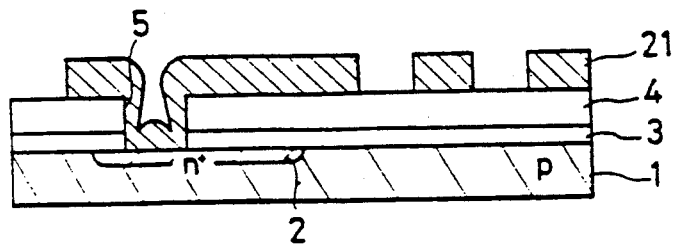
Figure 1C:
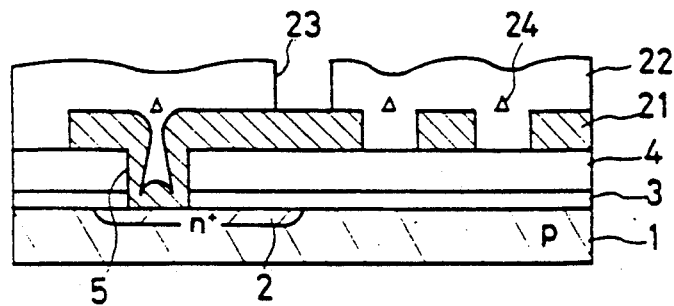

An embodiment of this invention is explained hereafter, referring to FIGS. 3(a) to (e) of the sections by steps. As shown in FIG. 3(a), an n+-type diffusion layer 2 is formed on the upper surface of P-type semiconductor substrate before silicon oxide layer 3 is deposited with the thickness of 3000 Å, e.g. by the CVD method and further, BPSG layer 4 is overlaid with the thickness of 7000 Å e.g. Next, a contact hole 5 is opened to connect with the n+-type diffusion layer 2. Furthermore, an undoped polysilicon layer 6, e.g., with a thickness of 500 Å is deposited on the entire surface. Then, to a make good ohmic contact with n+-type diffusion layer 2, arsenic ions, for example, are implanted (ion implantation) into the undoped polysilicon layer 6 with conditions of an accelerating voltage of 40 kV and doping of $5 \times 10^5/cm^2$ to mix the ions.

Next, the arsenic doped polysilicon layer 6 is patterned so that the part intended for the wiring remains according to the wiring pattern of the first layer, and an arsenic-doped polysilicon layer as a base layer is formed as shown in FIG. 3(b). Then a silicon nitride layer 7 is deposited on the whole surface with 8000 Å e.g. by the plasma CVD method.

Next, the silicon nitride layer 7 is etched, except the part intended for the wiring, by the photolithographic technique and the reactive ion etching technique using the reverse mask to the mask used at patterning of the polysilicon layer 6. Hereby polysilicon layer 6a in the area intended for the wiring is exposed. At this time, since it is difficult that the patterns of both polysilicon layer 6a and silicon nitride layer 7a, both of which are patterned separately, coincide completely, small deviations occur generally as shown in FIG. 3(c).

Next, tungsten for example, is grown on the exposed arsenic doped polysilicon layer 6a by the selective growth technique, and the first tungsten wiring 8 is formed as shown in FIG. 3(d).

Furthermore, in order to achieve a good ohmic contact between an n+-type diffusion layer 2 and arsenic-doped polysilicon layer 6a in which arsenic ions are implanted, heat treatment is carried out for 30 min. in nitrogen atmosphere at 700° C. Hereby, arsenic ions in the arsenic-doped polysilicon layer 6a are electrically activated. The first tungsten wiring 8 formed in this way is very plane and tungsten is fully deposited in the contact hole 5, so the layer thickness necessary for the wiring is secured to improve the step coverage. Further, since the silicon nitride layer 7 is embedded fully around the first tungsten wiring 8 on the BPSG layer 4, no cavity (blow hole) exists in the wiring layer. Next, as shown in FIG. 3(e), a silicon oxide layer 9 is deposited in thickness of 5000 Å on the whole surface, e.g., by the plasma CVD method and a through hole 23 is made to connect with the first tungsten wiring 8. Then the second wiring pattern material, for example, aluminum, is deposited in thickness of 1.0 μm and the second aluminum wiring 10 is formed by patterning according to the second wiring pattern.

The semiconductor device manufactured as above has the following advantages:

First of all, since the arsenic doped polysilicon layer 6a can be formed in a relatively thinner thickness, it can be subjected to micropatterning according to the first wiring pattern on the BPSG layer 4 having contact hole 5. Therefore it is easy to microminiaturize the first tungsten wiring 8 formed by making tungsten grow on the arsenic doped polysilicon layer 6a as the first base layer. Furthermore, in the growing stage of tungsten, tungsten is grown until the layer becomes plane, and consequently the planarity of the surface of the first tungsten wiring 8 is improved. Hereby the second aluminum wiring 10 formed on the surface of the plane of the first tungsten wiring 8 covered with silicon oxide layer 9, is clearly planer than that of the second aluminum wiring 26 in FIG. 1(d) which shows a conventional case, and its reliability increases.

Figure 1D:
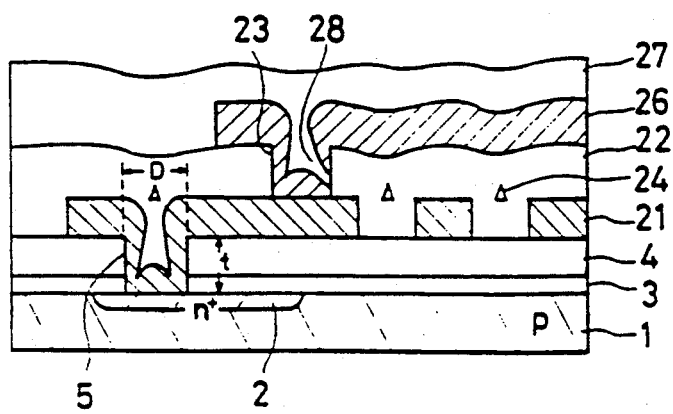
Figure 2A:
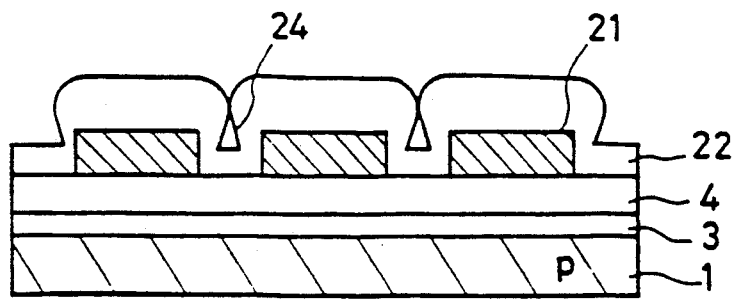
FIGS. 2(a) and (b) are sectional view of a semiconductor device made by the conventional manufacturing method.
Figure 2B:
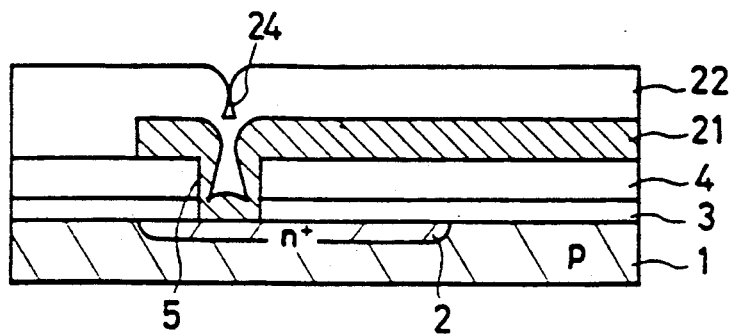

Since silicon nitride layer 7a is formed before the patterning of arsenic doped polysilicon layer 6a in the area on the BPSG layer 4 in which the first tungsten wiring 8 does not exist, the cavity 24 which exists in the conventional case shown in FIG. 1(d) and FIGS. 2(a) and (b) is not formed. Therefore, reactant gas is not sealed in the layer during the deposition of the silicon oxide layer 9 by the plasma CVD method.

Furthermore, since tungsten is embedded in the contact hole 5, the layer thickness necessary for the wiring is secured also in the contact hole 5 and the step coverage of the wiring is improved.

Since as mentioned above, a fine wiring pattern is formed with high controllability and good planarity and no cavity exists in the insulating film between layers, the semiconductor device can maintain high reliability for a long time.

The above description is an embodiment that applies this invention to the semiconductor device of two-layer wiring structure, and can be applied also to devices having three- or more wiring structures. Another embodiment of a three-layer wiring structure is shown in FIG. 4.

Here the processes up to formation of the first tungsten wiring 8 is the same as the steps up to FIG. 3(d) in the case of a two-layer wiring structure. After that, silicon oxide layer 9 is deposited with a thickness of 5000 Å on the entire surface, e.g., by the plasma CVD method and a through hole 15 is made to connect with the first tungsten wiring 8. Then the undoped polysilicon layer as the base layer which enables selective growth of the second wiring materials is deposited with a thickness of 500 Å, e.g., before arsenic ions are implanted to mix the ions.

Figure 4:
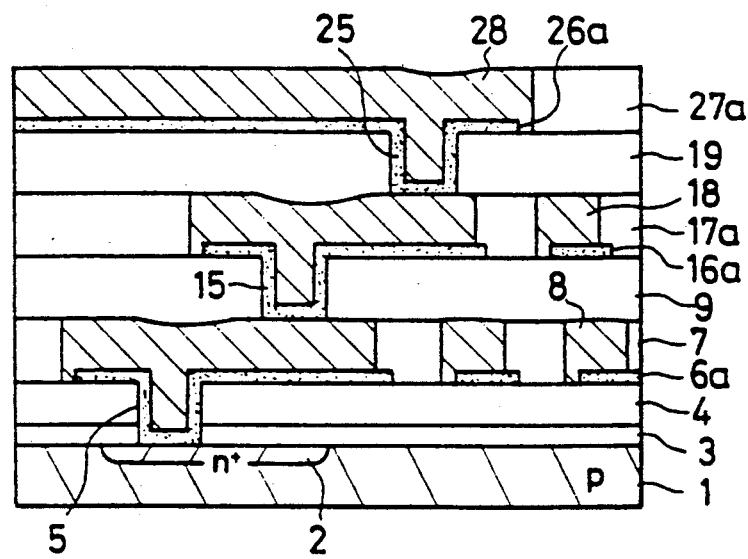
FIG. 4 is a sectional view of a semiconductor device according to the second embodiment of this invention.

Next the undoped polysilicon layer is patterned according to the wiring pattern of the second layer to make the undoped polysilicon layer 16a as shown in FIG. 4.

Also, a silicon nitride layer is deposited in thickness of 8000 Å on the entire surface, e.g., before etching to expose the undoped polysilicon layer 16a and tungsten is grown on the exposed part to form the second tungsten wiring 18. Then, heat treatment is carried out for 30 min. in nitrogen atmosphere at 700° C. in the same way as the case of the first tungsten wiring 8 to activate electrically the arsenic ions in the polysilicon layer 16a.

Further repeating the same processes as the above, silicon oxide layer 19, undoped polysilicon layer 26a and silicon nitride layer 27a are formed before tungsten is grown on the polysilicon layer 26a to form the third tungsten wiring 28.

In the case of this embodiment as well, the first, second and third wiring patterns can be formed with good controllability and planarity as in the embodiment shown in FIG. 3, the step coverage of this wiring is also improved and no cavity exists in the respective interleveldielectric films between the layers, to therefore provide a semiconductor device of higher reliability.

In the embodiment mentioned above, the polysilicon layer is used as the base layer which causes selective growth of the wiring material, but other materials such as copper, tungsten, aluminum and titanium can be used. In addition, when the polysilicon layer is used as base layer, aluminum, copper, molybdenum and tungsten silicide, etc. can be used as the wiring layer instead of tungsten.

Furthermore, the first interleveldielectric film, i.e. the BPSG layer 4 and the second interleveldielectric film, i.e. a silicon nitride layer 7 in FIG. 3(b) differ in material.

The material need not always be changed, but the following result is obtained when the material is changed as above. That is, as shown in FIG. 3(c), the pattern of silicon nitride layer 7 and that of the polysilicon layer a formed by patterning frequently deviate a little from one another, and an area of the surface of BPSG layer 4 is exposed. In such a case also, the etching conditions are different because of difference in material, and because the BPSG layer 4 in the part which is exposed during the etching of silicon nitride layer 7, cannot be removed.

FIGS. 5(a) to (h) are sectional views illustrating the manufacturing method of a semiconductor device according to the third embodiment of this invention, in the order of steps.

Figure 5A:
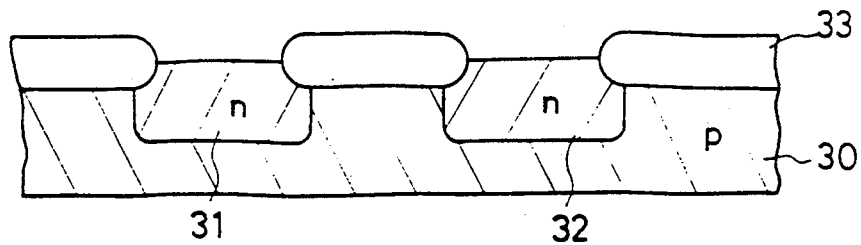
FIGS. 5(a) to (h) are sectional views illustrating the manufacturing method of a semiconductor device concerned with the third embodiment of this invention, in the order of steps.

As shown in FIG. 5(a), a P-type semiconductor substrate 30 having two diffusion layers 31 and 32 is first formed by interposition on the surface, of insulating layers 33 such as silicon oxide layers, is prepared. The insulating layer 33 is formed by selective oxidation of the P-type semiconductor substrate 30. That is, two n-type diffusion layers 31 and 32 are formed by ion implantation of impurities such as phosphorus and arsenic by using the isolation layer 33 as a mask and by subsequent heat treatment of these impurities to activate then electrically. It is desirable that impurity concentration in the surfaces of two n-type diffusion layers 31 and 32 is high enough to achieve good ohmic contact with the aluminum base layer 34 forming the under-layer, mentioned later. This is because making the carrier concentration of the diffusion and electroconductive layers basically higher lessens or thins the Schottky barrier and as a result, facilitates tunneling of carriers so that good ohmic contact can be secured. Therefore, when the n-type diffusion layers 31 and 32 are formed by the ion implantation as mentioned above, the dose quantity, acceleration voltage, species of the ion and heat treatment condition need to be determined by taking the above the into consideration. Furthermore in this embodiment is formed wiring that connects the abovementioned two n-type diffusion layers 31 and 32.

Figure 5B:
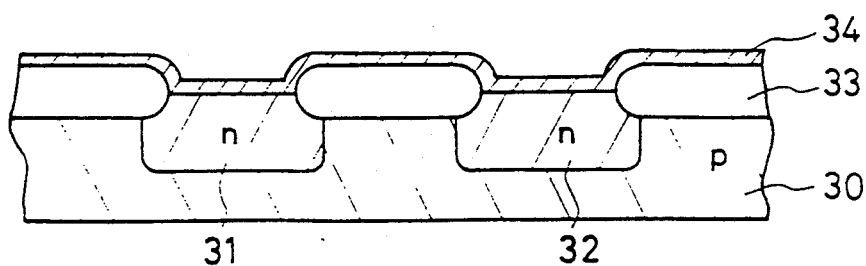

Successively, as shown in FIG. 5(b), a thin aluminum layer 34 which acts as a base layer for growth of the wiring material is formed with a thickness of 1000 Å on the entire upper surface of the P-type semiconductor substrate 10. It is desirable for the base layer 34 to have high electrical conductivity, not to react with the lower layer (in FIG. 5(b), n-type diffusion layers 31 and 32) when subjected to heat treatment, and to permit good ohmic contact. In other words, formation of unnecessary electrical barriers other than a small, thin barrier of ohmic contact should not be produced in the heterojunction area formed by n-type diffusion layers 31 and 32 and the base layer 34. The materials other than aluminum which conform to the above requirement are for example, Al-Si, Al-Si-Cu, metals such as copper, tungsten and molybdenum, or silicides of the above-mentioned metals of high melting point, silicides of titanium, cobalt, etc., nitrides of tungsten, titanium, etc., such layers as poly-crystal silicon doped with impurities to be electrically active as in the embodiment of FIG. 3 or films having multilayer structure of these layers that have a high melting point and excel in heat resistance and reaction resistance. Furthermore, the thickness of the base layer 34 is determined in consideration of the difference by pattern conversion in processing, the property as a barrier to chemical reaction in film formation and heat treatment in the after-processing, and stress distribution, etc. The base layer is formed by chemical vapor deposition (called CVD), metal organic CVD (MOCVD), optical CVD, plasma activated CVD (PCVD), which utilize chemical reaction, magnetron sputter, beam lead method, etc.

Figure 5C:
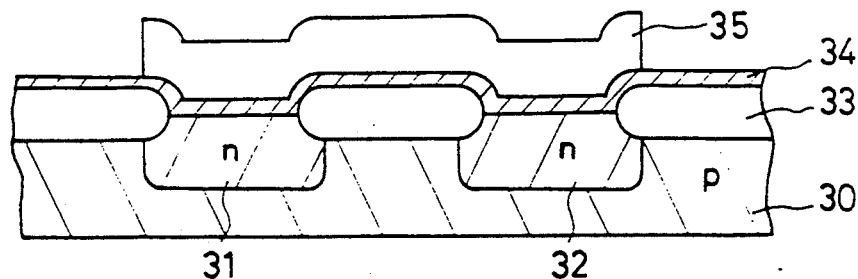

In order to keep only the selected area of thus prepared base layer 34 (that is, on n-type diffusion layers 31 and 32 of the area expected for the circuit on the isolation layer 33 between two diffusion layers) and to remove the other areas, as shown in FIG. 5(c), resist is exposed selectively and the etching mask pattern 35 is formed by developing the resist.

Figure 5D:
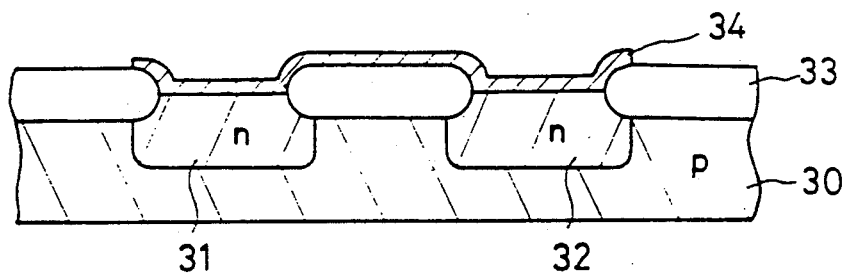

As shown in FIG. 5(d), the areas other than the area expected for the circuit of base layer 34 are successively removed by RIE etching using a resist pattern 35 as a mask. After that, the mask pattern is removed by etching.

Next, as shown in FIG. 5(e), a 10000-Å thick silicon oxide layer 36 is formed on the entire surface, including the area expected for the wiring by the CVD method.

Then, as shown in FIG. 5(f), a resist pattern 37 having openings in the area intended for the wiring is formed on the silicon oxide layer 36.

Advanced to the step of FIG. 5(g), the silicon oxide layer 36 on the area intended for the wiring, i.e., base layer 34 is removed using resist pattern 37 as a mask. After that, the resist 37 is removed.

As shown in FIG. 5(h), a conductive material is successively grown to practically the same level as the adjacent oxide layer 36 by the selective CVD method using the exposed base layer 34 as nuclide to form a wiring layer 38.

In addition, "practically the same level" herein not only means perfectly the same level but also includes the gap 28 shown in FIG. 1(d) and gaps that have no cavity 24 as shown in FIGS. 2(a) and (b).

Figure 6:
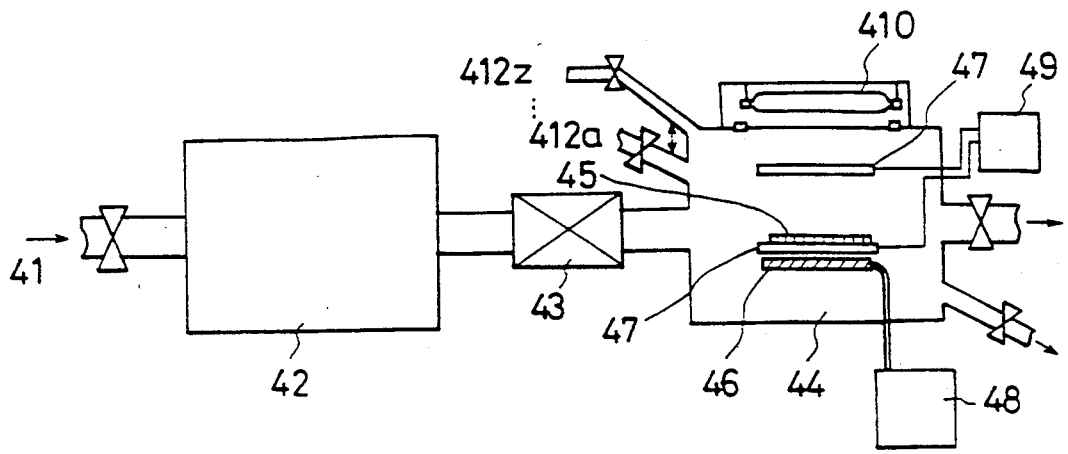
FIG. 6 illustrates a CVD device which can be used for the manufacturing method of this invention.

In addition, the CVD equipment shown in FIG. 6 is used to form the wiring layer 38. The CVD equipment is explained particularly with reference to FIG. 6 hereinafter.

The substrate of which only the area intended for the wiring of base layer 34 is exposed and the other area is covered with insulating layer 33 (the substrate whose processing up to FIG. 5(g) has been completed) is introduced from inlet 41. Next, the substrate is sent to the pre-chamber and pretreatment necessary for selective growth of the wiring layer, for example cleaning, is performed. The substrate is succesively transferred to the switching chamber 43, where the atmosphere is changed for the next selective wiring growth chamber 44. Then the substrate 45 is moved to the selective wiring growth chamber 44, and the gases for selective growth, for example organic tungsten gas, reducing $H_2$ gas and $SiH_4$, are fed from respective inlets 412a to 412z under time-series control of their pressure and the order of feed and discharge. Furthermore, temperature of suscepter 46 serving as a field impression electrode is controlled by a temperature controller 48. On the other hand, an electric field is applied between two electrodes 47 connected with a power supply 49, appropriate electromagnetic waves are radiated from a lamp 410 through a window 411 and the temperature cycle of the substrate 45 is controlled by the suscepter 46. Hereby a desired metal, semiconductor or multilayers of them can be grown selectively on the base layer 34 formed in the area intended for the wiring.

If such a manufacturing method of semiconductor devices is used, the base layer 34 is formed in the area intended for the wiring and the wiring layer 38 can be grown selectively on only the base layer 34. In the case of selective growth of wiring layer 38, the wiring layer 38 of any given thickness can be formed by controlling the processing time, partial pressure of the vapor-phase materials, wave length of the lamp light, strength, and electric field intensity, etc. Therefore the selective growth of the wiring layer 38 to practically the same level with that of oxide layer 36 results in good planarity and consequently substantially eliminates the conventional problem of gap formation of the wiring layer and formation of unexpected wiring patterns.

Figure 7:
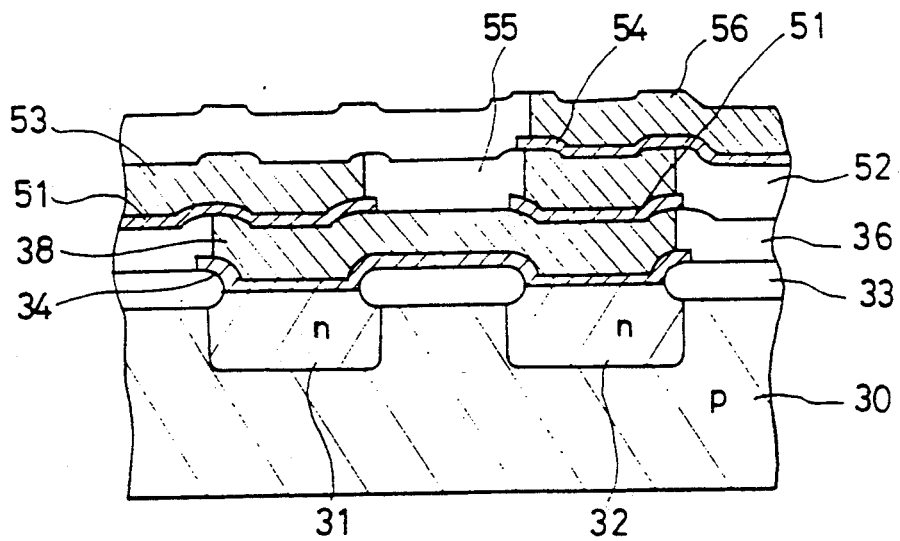
FIG. 7 is a sectional view of a semiconductor device according to the fourth embodiment of this invention.

FIG. 7 illustrates a section of the semiconductor device manufactured by forming on the wiring layer 38 in FIG. 5(h), another additional wiring layer according to the method of this invention. Numbers indicated in FIG. 7 correspond to those in FIG. 5.

When forming additional circuit on the wiring layer 38 formed at the step of FIG. 5(h), a thin aluminum film 51 as a base layer for another wiring is formed on the entire upper surface of the wiring layer 38 and insulating layer 36, as shown in FIG. 7. After that, the base layer 51 is treated selectively and the only the area intended for the wiring is left unremoved. Next, the insulating layer 52 is formed on the whole surface including the area intended for the wiring and then the isolation layer 52 on the area intended for the wiring is removed. Thereafter the conductive material is grown to practically the same level as that of the adjacent insulating layer 52 using a base layer 51 as a seed, resulting in formation of wiring layer 53.

FIG. 7 illustrates an embodiment in which three wiring layers are formed repeatedly in the same way.

Reference number 54 in the figure is a base layer on which the third wiring layer is formed, 55 is an insulating layer that insulates third-layer wiring. In the same way, the fourth and the fifth layers can be overlaid.

This manufacturing method can maintain the same planarity as the first layer even if many wiring layers are overlaid.

Figure 8:
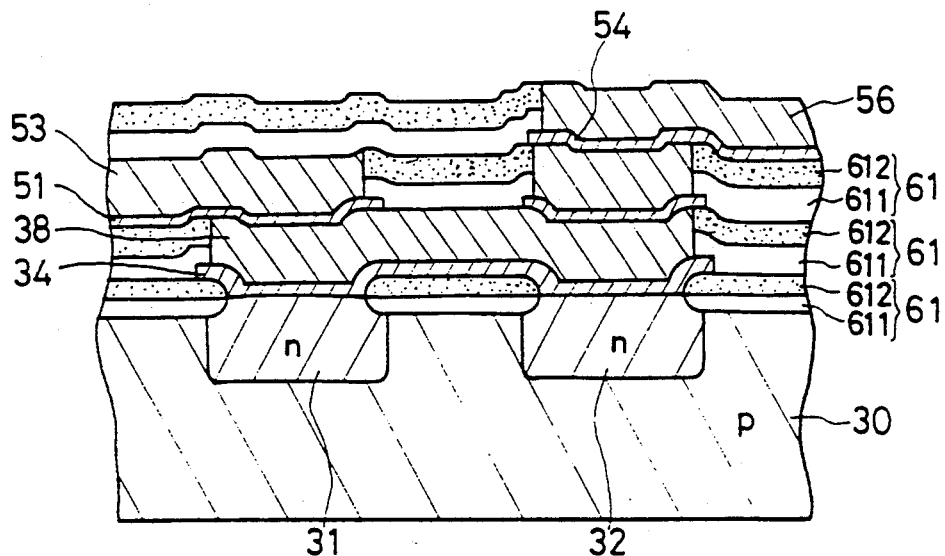
FIG. 8 is a sectional view of a semiconductor device according to the fifth embodiment of this invention.

FIG. 8 illustrates a section of a semiconductor device manufactured using the manufacturing method of semiconductor devices according to the fifth embodiment of this invention. Numbers indicated on the drawing in FIG. 8 correspond to those in FIG. 7.

In the embodiment illustrated in FIG. 7, such a stress migration problem occurs in that wiring is broken by stress applied to an isolation layer, etc. with increase of overlays such as isolation and wiring layers. In the embodiment shown in FIG. 8, an isolation layer 61 is formed with a two-layer structure to reduce the above problem. That is, the lower layer 611 is made of phospho-silicate glass (PSG) and the upper layer 612 is made of silicon nitride (SiN) so that both layers differ in their coefficients of thermal expansion and the reactivity of the material with the wiring. Then, the ratio of layer thickness of PSG layer to the SiN layer is set at a proper value, whereby the stress in the entire layer structure such as the stress of SiN and PSG, is cancelled to restrict the stress migration. Since it naturally depends also on the stresses of wiring layers 38, 53 and 56, it depends on the material, structure and conditions of formation, etc. of wiring layers 38, 53 and 56. Furthermore, for multi-layer wiring structures, there is a method that changes the layer thickness ratio of the SiN layer to the PSG layer is changed in each isolation layer 61 (for example, SiN layer thickness:PSG layer thickness=1:4 for the first layer, SiN layer thickness:PSG layer thickness=3:2 for the second layer, etc.), a method that changes the condition of formation of the isolation layer 61 for each layer, and thus other means. It is possible to control the stress by these methods and restrict the stress migration to increase reliability. On the other hand, the stress distribution may be controlled by changing the component ratio of x to y in $SiN_xO_y$ for wiring layers 38, 53 and 56 in isolation layers 61 of SiNO (oxinitride).

Figure 9:
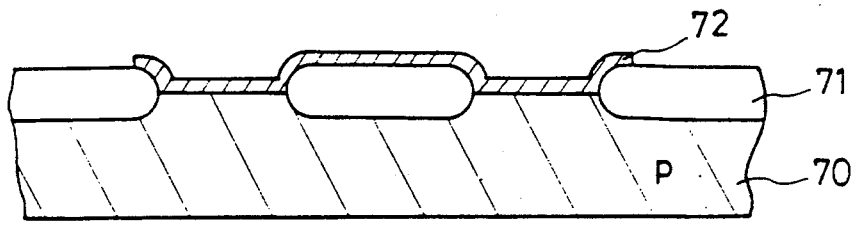
FIGS. 9(a) and (b) are sectional views illustrating the manufacturing method of a semiconductor device according to the sixth embodiment of this invention in the order of the steps.
Figure 9:
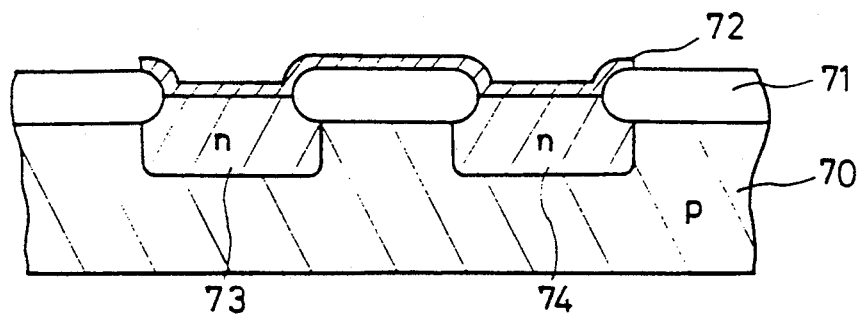

FIGS. 9(a) and (b) are sectional views illustrating the manufacturing method of semiconductor devices according to the sixth embodiment of this invention in the order of manufacturing steps.

In the first to the fifth embodiments, the diffusion layer is formed before a base layer is formed on it. Furthermore, it can be formed, for example, by ion implantation after the formation of the base layer.

As shown in FIG. 9(a), the surface of p-type semiconductor substrate 70 is selectively oxidized at first to form such an insulating layer 71 as silicon oxide layer. Successively, aluminum thin layer 72 as a base layer is formed on the whole upper surface of substrate 70 having the insulating layer 71.

Figure 5:
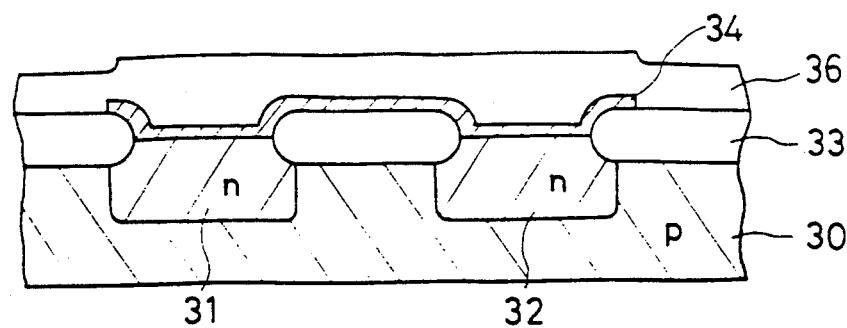
Figure 5:
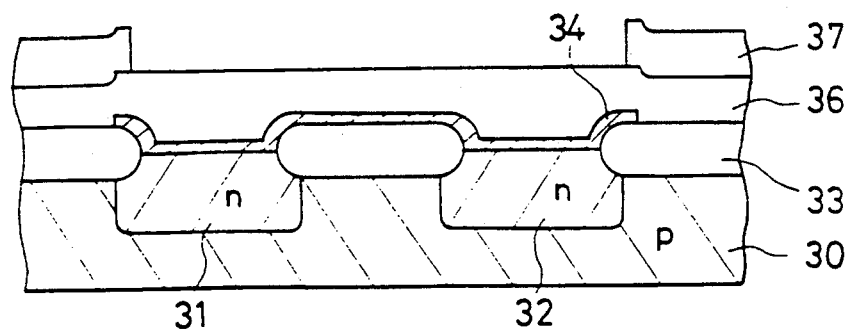
Figure 5:
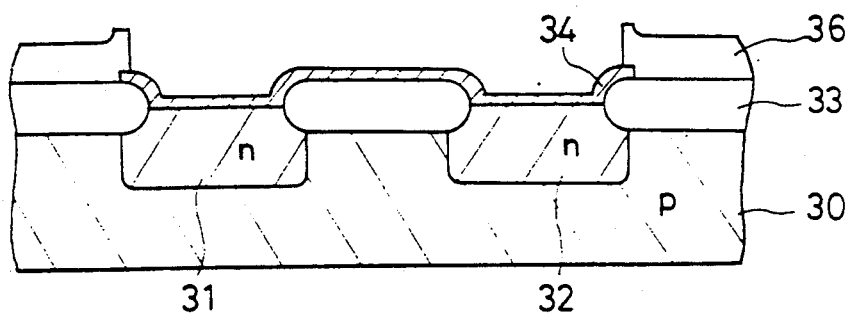
Figure 5:
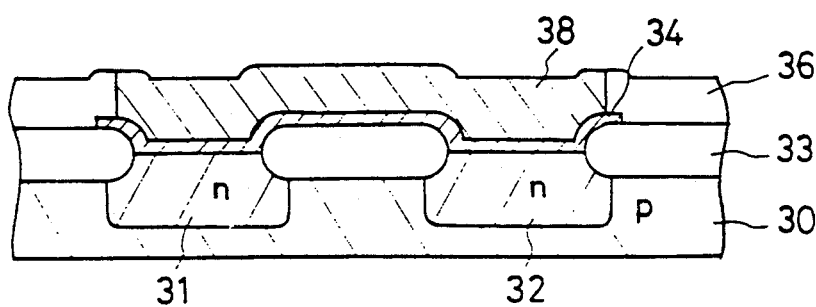

The condition and method of formation of the base layer 72 are the same as those of the embodiment in FIG. 5. The prepared base layer 72, except the area intended for the wiring, is removed in such way.

Next, as shown in FIG. 9(b), n-type impurities such as phosphorus and arsenic are ion-implanted into the substrate 70 using an insulating layer 71, as a mask, these impurities are activated by heat treatment for a short time to, prevent the reaction between Al and Si by rapid thermal annealing, etc. to form two n-type diffusion layers 73 and 74.

After that, an insulating layer is formed in the part other than the base layer 72 and a wiring layer is grown selectively on a base layer 72. This process is the same as the example of FIG. 5.

Using this wiring manufacturing method can carry out simultaneously both the heat treatment for making ohmic contact between diffusion layers, 73 and 74, and the base layer 72, and the heat treatment for activating impurities necessary for formation of diffusion layers 73 and 74. The heat treatment, which had been required two times, can be performed in one operation, so that the diffusion layers of shallow depth caused by a short heat treatment time and of high surface impurity concentration can be obtained. Therefore, the ohmic resistance can be made smaller.

FIGS. 10(a) to 10(f) are sectional views illustrating the method of manufacturing semiconductor devices according to the seventh embodiment of this invention, in the order of manufacturing steps.

At first, as shown in FIG. 10(a), a p-type semiconductor substrate 80 having two diffusion layers 81 and 82 formed between an insulating layer 83 such as silicon oxide layer on the surface is prepared. This formation method is the same with the embodiment of FIG. 5. In addition, the circuit connecting the abovementioned two diffusion layers 81 and 82 with one another is formed in this embodiment. Then an insulating layer 84 is formed on the whole upper surface of p-type semiconductor substrate 80.

Plasma CVD method, for example, is given as this formation method and a silicon oxide layer of approximately 12000-Å thick is formed.

Successively, referring to FIG. 10(b), the formed insulating layer 84 is treated selectively so that the resist pattern 85 having openings in the area intended for the wiring is formed.

At the succeeding step of FIG. 10(c), the layer on the area intended for the wiring, of insulating layer 84 is removed by such a method as reactive ion etching, using the resist pattern 85 as a mask.

After that, as shown in FIG. 10(d), aluminum thin layer 86 to be a base layer is formed on n-type diffusion layers 81 and 82 and on an insulating layer 83 between these two diffusion layers and the whole upper surface of insulating layer 84. This method and conditions of formation, are the same as those of the embodiment of FIG. 5.

At the succeeding step of FIG. 10(e), a base layer 86 on n-type diffusion layers 81 and 82, which are the areas intended for the wiring, and the insulating layer 83 between these two diffusion layers is left unprocessed.

Next, referring to FIG. 10(f), an electroconductive material is grown to practically the same level as the adjacent insulating layer 84 to form a wiring layer on base layer 86. The selective growth method and conditions of formation in this case are the same as the embodiment of FIG. 5.

This manufacturing method permits good planarity of semiconductor devices as well as the embodiment of FIG. 5 and lessens the formation of gaps of wiring layers and/or unintended wiring patterns which have been a problem up to now. In addition, in the case of the embodiment of FIG. 5, Photo Engraving Process (PEP) is performed twice until wiring formation, that is, the process which leaves a base layer 34 formed on the whole surface of substrate 30 unremoved only in the areas intended for the wiring (FIG. 5(c)) and the step which makes openings in the area intended for the wiring, of an oxide layer 36 formed on the entire upper surface of substrate 30 including the intended for the wiring area (FIG. 5(f)).

Figure 10:
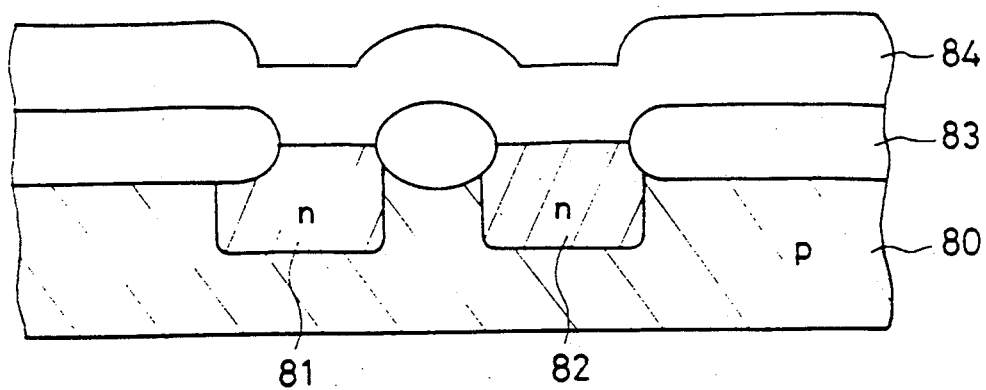
FIGS. 10(a) to (f) are sectional views illustrating the manufacturing method of a semiconductor device according to the seventh embodiment of this invention in the order of processes.
Figure 10:
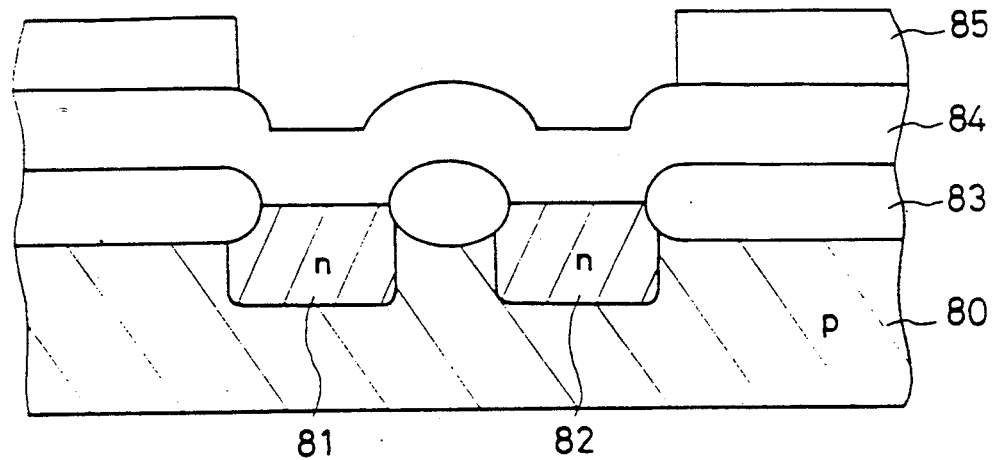
Figure 10:
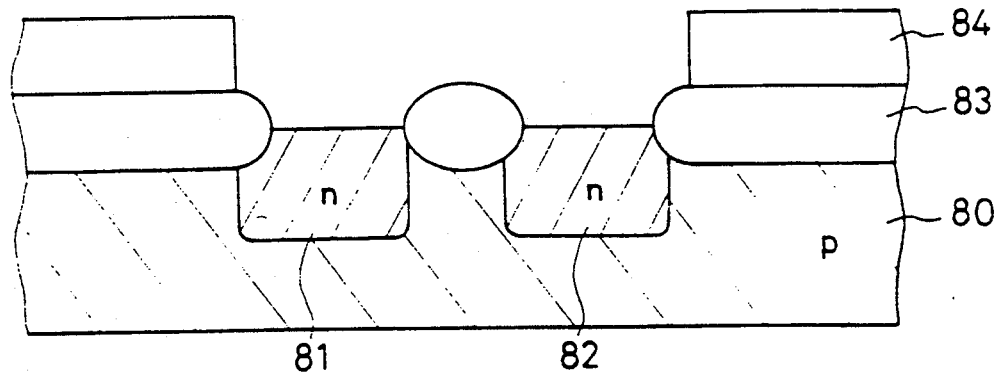
Figure 10:
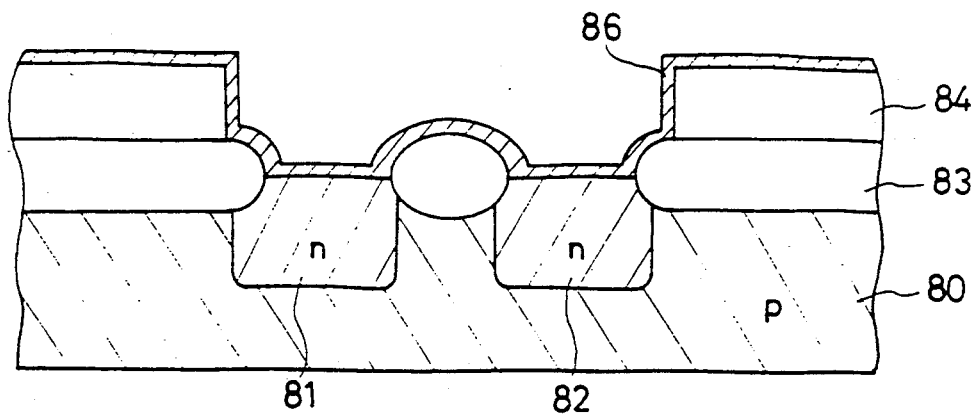
Figure 10:
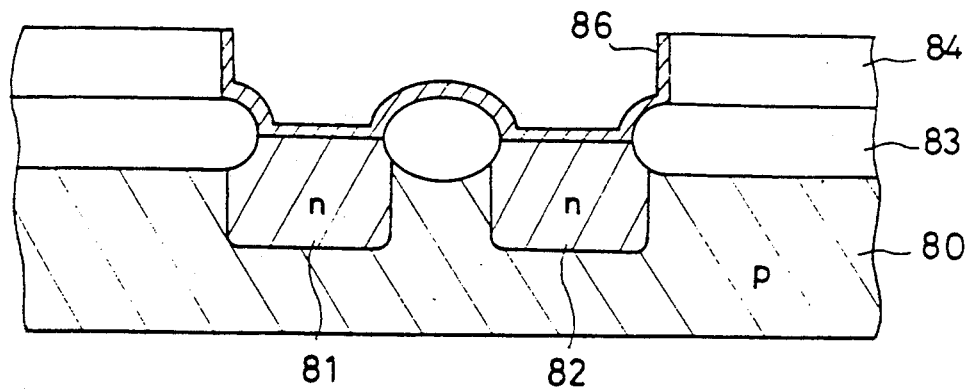
Figure 10:
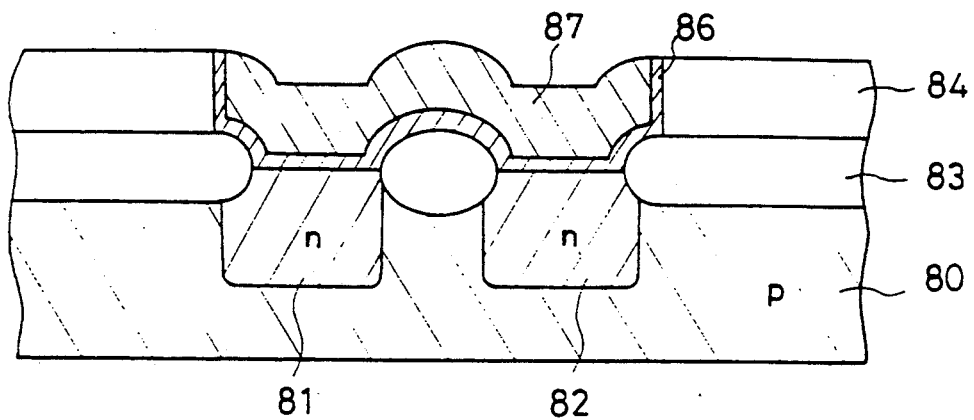

In the PEP of the embodiment of FIG. 10, the step is performed twice to make openings in the area intended for the wiring, of insulating layer 84 formed on the whole upper surface of substrate 80 is changed to be performed only once (FIG. 10(b)). Introduction of the PEP performed only once permits simplification of the process and eliminates the margin for of deviation of the mask 35 formed on the upper part of base layer 34 in order to leave base layer 34 unremoved only on the intended parts intended for the wiring, in FIG. 5(c).

Figure 11:
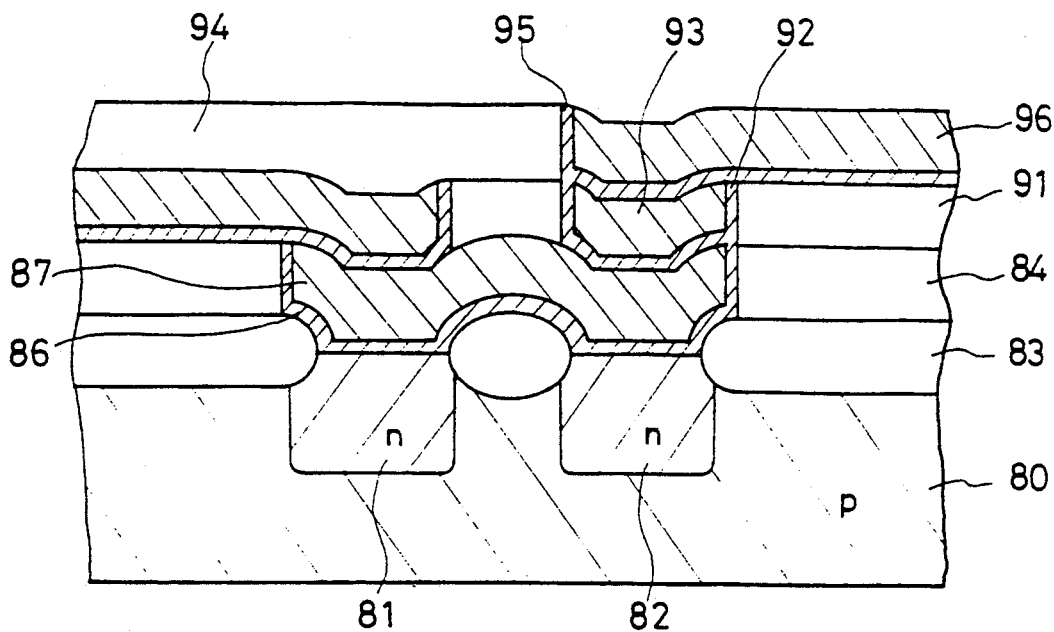
FIG. 11 is a sectional view of a semiconductor device according to the eighth embodiment of this invention.

FIG. 11 is a sectional view illustrating a semiconductor device manufactured by forming another wiring layer in the same way as FIG. 10(f) on a wiring indicated on the drawing in FIG. 11 correspond to those in FIG. 10.

In the case where another wiring layer is formed on the wiring layer 87 in FIG. 10(f), an insulating layer 91 is formed on the whole upper surface of wiring layer 87 and insulating layer 84. Successively, an isolation layer 91 on the area intended for the wiring is removed. Next, a thin aluminum layer 92 as a base layer is formed on the whole surfaces of insulating layer 84, wiring layer 87 and isolation layer 91. Successively, the base layer 92 is left unremoved only on the area intended for the wiring, for example, by the etching back method. Then an electroconductive material is grown to practically the same level as that of adjacent isolation layer 91 using the base layer 92 to form a wiring layer 93. FIG. 11 illustrates an embodiment in which the three wiring layers are formed by repeating the same steps. Herein, reference number 94 is an insulating layer insulating between the wiring of the third layer, 95 is a base layer to form the third wiring layer 96. It is possible to overlay the fourth and the fifth wiring layers in the same way.

When this manufacturing method is adopted, cavities in insulating layer 91 do not form as described in the embodiment of FIG. 7 and planarity is maintained. Moreover, as mentioned in the embodiment of FIG. 10, the PEP can be reduced so that the process for multi-layer wiring can be simplified.

Figure 12:
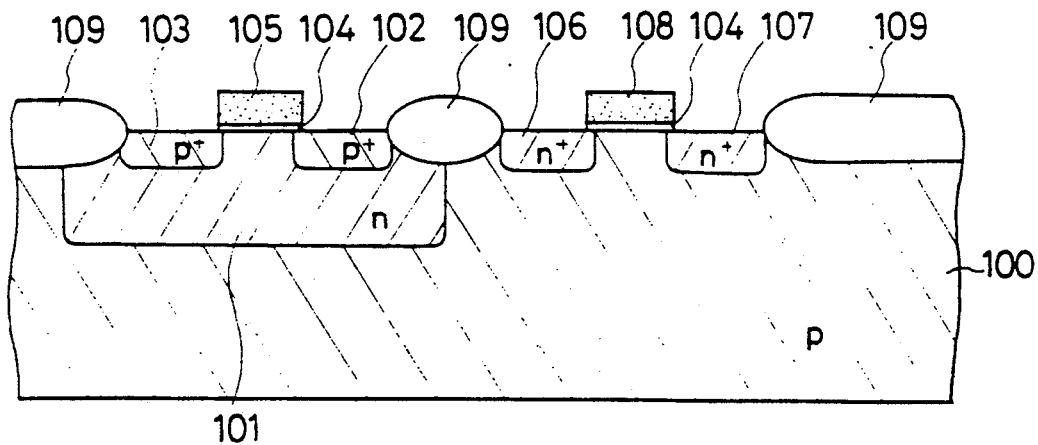
FIGS. 12(a) and (b) are sectional views illustrating the manufacturing method of a C-MOS circuit according to the ninth embodiment of this invention, in the order of steps.
FIG. 12(c) is a circuit diagram of a C-MOS circuit according to the ninth embodiment of this invention.
Figure 12:
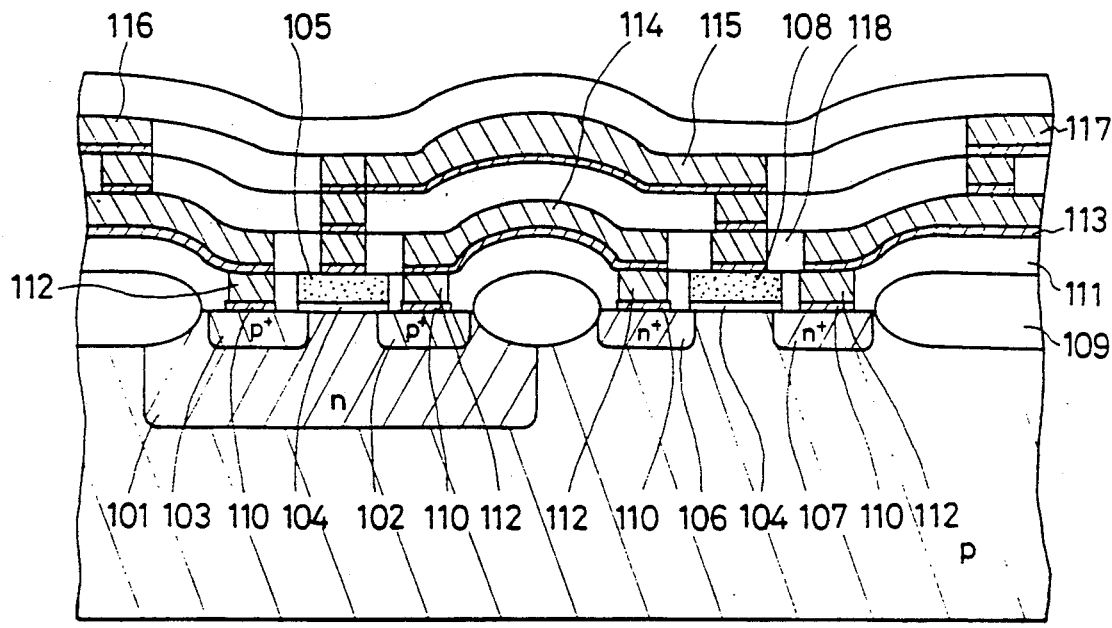
Figure 12:
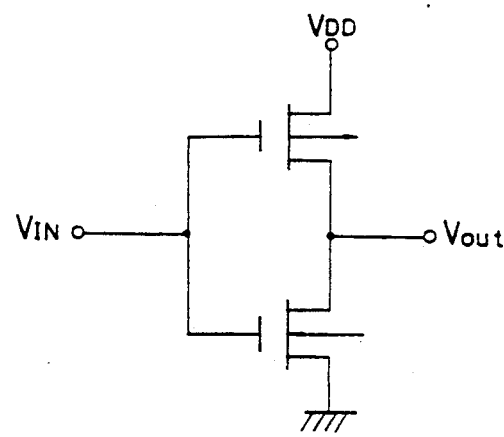

FIGS. 12(a) and (b) are sectional views illustrating the manufacturing method of C-MOS inverter according to the ninth embodiment of this invention. FIG. 12(c) is a figure illustrating a C-MOS inverter according to the seventh embodiment of this invention.

This embodiment is the case where the manufacturing method of semiconductor devices of this invention is applied to the formation of C-MOS (Complementary-MOS) inverter. Referring to FIG. 12(a), at first, n-type well 101 is formed by selective ion implantation of impurities to p-type Si substrate 100. After that, field oxidized layer 109 is formed by field oxidation. Then n+ layer 106 to be a drain electrode and n+ layer 107 to be a source electrode are formed by ion implantation. Furthermore, a p+ layer 102 to be a drain electrode and p+ layer 103 to be a source electrode are formed in the same way or p− layer and n− layer of source and drain electrodes may be formed with self conformity using a gate electrode mentioned later as a mask. Successively, thin oxide layer 109 and multi-crystal silicon gate electrode (p-type multi-crystal silicon 105 for p-type transistor, n-type multi-crystal silicon 108 for n-type transistor) are formed selectively on the gate area.

Then, as shown in FIG. 12(b), a base layer 110 is formed on source electrodes 103 and 107 and drain electrodes 102 and 106 by the same method as shown in FIG. 5 and then an insulating layer 111 is formed to practically the same level as that of gate electrodes 105 and 108. Successively, electroconductive material is grown selectively to practically the same level as that of gate electrodes 105 and 108 and insulating layer 111, resulting in the formation of a circuit layer 112. This formation method is also the same as the example in FIG. 5. Next, base layer 113 is formed on the insulating layer 111, wiring layer 112 and gate electrodes 105 and 108 in the same way. After that, an insulating layer 118 is formed and the base layer 113 is selectively grown to form a wiring layer 114 connecting drain electrodes 102 and 106. Furthermore, by repeating the same step, a wiring layer 115 which connects gate electrodes 105 and 108, a wiring layer 116 which grounds the source electrode 103 of a p-type transistor, and a wiring layer 117 which connects source electrode 107 of a n-type transistor with the electrical source are formed.

The circuit diagram of a C-MOS inverter formed in this way is illustrated in FIG. 12(c).

This manufacturing method permits good planarity in the case of multi-layers and keeps better contact coverage than conventional methods.

Figure 13:
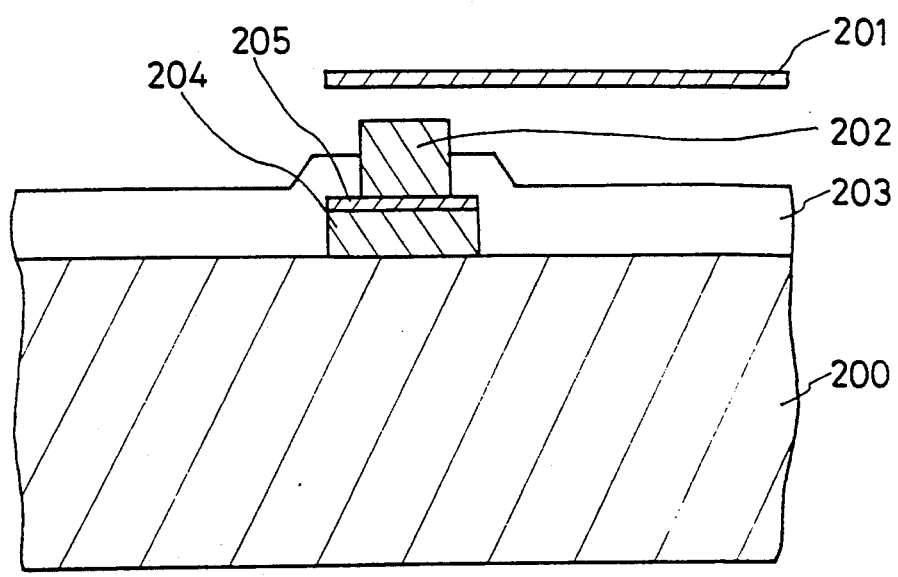
FIG. 13 is a sectional view of a semiconductor device according to the tenth embodiment of this invention.

FIG. 13 is a sectional view illustrating the semiconductor devices manufactured by application of the manufacturing method of the semiconductor devices according to the tenth embodiment of this invention.

In this embodiment the manufacturing method of semiconductor devices of this invention is applied to the Tape Automated Bonding (TAB).

At first, a semiconductor substrate 200 on which wiring layer 204 has been formed in selected areas is prepared. A wiring layer 204 may be formed by an arbitrary method. Next, a base layer 205 is formed on the wiring layer 204. The method and conditions of formation are the same as those in the embodiment of FIG. 5. Successively, an insulating layer 203 is formed on the entire surface of semiconductor substrate 200 and base layer 205 and insulating layer 203 in the areas which serve as bonding pad is removed. After that, the electroconductive material is grown to the higher level than adjacent insulating layer 203 using vase layer 205 in exposed areas as a base to form the bonding pad 202. The method and conditions of growth are the same as that of the embodiment in FIG. 5.

When this manufacturing method is applied, the bonding pad becomes smaller because of no mask deviation at the formation of wiring layers, and it is suitable for increasing adhesion with the inner lead 201 and for micro-processing because surface planarity becomes better.

The above descriptions are preferable embodiments of this invention and it is to be understood that the scope of this invention is not limited only to those embodiments.

What is claimed is:

1. A method of manufacturing semiconductor devices, comprising the steps of:
preparing a semiconductor substrate, on the surface of which is formed a first insulating layer having a contact hole;
forming an electroconductive base layer in a desired wiring pattern on the first insulating layer and on the semiconductor substrate in the contact hole;
forming a second insulating layer on the first insulating layer except on an area of the desired wiring pattern defined by the base layer; and
growing a wiring layer selectively only on the base layer up to practically the same level as the surface of the second insulating layer, whereby the wiring layer is formed in the desired wiring pattern.

2. The method of claim 1, in which the step of forming a second insulating layer include forming the second insulating layer over the whole of the base layer and the first insulating layer and removing the second insulating layer from the base layer.

3. A method of manufacturing semiconductor devices, comprising the steps of:
preparing a semiconductor substrate, on the surface of which is formed a first insulating layer except on a predetermined area for electric contact;
forming an electroconductive base layer in a desired wiring pattern on the first insulating layer and on the semiconductor substrate in the predetermined area;
forming a second insulating layer on the first insulating layer except on an area of the desired wiring pattern defined by the base layer; and
growing a wiring layer selectively only on the base layer up to practically the same level as the surface of the second insulating layer, whereby the wiring layer is formed in the desired wiring pattern.

4. The method of claim 3, in which the step of forming a second insulating layer include forming the second insulating layer over the whole of the base layer and the first insulating layer and removing the second insulating layer from the base layer.

* * * * *